United States Patent [19]

Ai et al.

[11] Patent Number: 4,778,859
[45] Date of Patent: Oct. 18, 1988

[54] TETRAMINE DERIVED POLYIMIDE WITH PENDANT UNSATURATION, AND VARIOUS PHOTOSENSITIVE COMPOSITIONS THEREFROM

[75] Inventors: Hideo Ai; Akihiko Ikeda; Kan-ichi Yokota, all of Fuji, Japan

[73] Assignee: Asahi Kasei Kogyo Kabushiki Kaisha, Japan

[21] Appl. No.: 856,476

[22] Filed: Apr. 28, 1986

[30] Foreign Application Priority Data

Apr. 27, 1985 [JP] Japan .................. 60-91485
Jun. 25, 1985 [JP] Japan .................. 60-138763

[51] Int. Cl.⁴ .................. C08G 73/10; C08G 73/12
[52] U.S. Cl. .................. 525/421; 525/426; 525/432; 525/435; 525/436; 528/125; 528/126; 528/128; 528/170; 528/172; 528/173; 528/179; 528/182; 528/183; 528/187; 528/189; 528/220; 528/222; 528/224; 528/226; 528/229; 528/351; 528/352; 528/353
[58] Field of Search .................. 525/421, 426; 528/125, 528/126, 128, 170, 172, 173, 179, 182, 183, 187, 189, 220, 222, 224, 226, 229, 351

[56] References Cited

U.S. PATENT DOCUMENTS 3,528,950  9/1970  Lubowitz .................. 528/229
3,708,459  1/1973  Lubowitz .................. 528/353
3,781,247  12/1973  Burns et al. .................. 528/353
4,321,319  3/1982  Shoji et al. .................. 430/270
4,481,340  11/1984  Minnema et al. .................. 525/426

FOREIGN PATENT DOCUMENTS 0131992  1/1985  European Pat. Off. .

Primary Examiner—Harold D. Anderson
Assistant Examiner—Frederick Krass
Attorney, Agent, or Firm—Berman, Aisenberg & Platt

[57] ABSTRACT

A curable composition comprising (a) a curable polyimide soluble in organic solvents and (b) a polymerization initiator as essential components, said polyimide consisting of recurring units represented by the formula

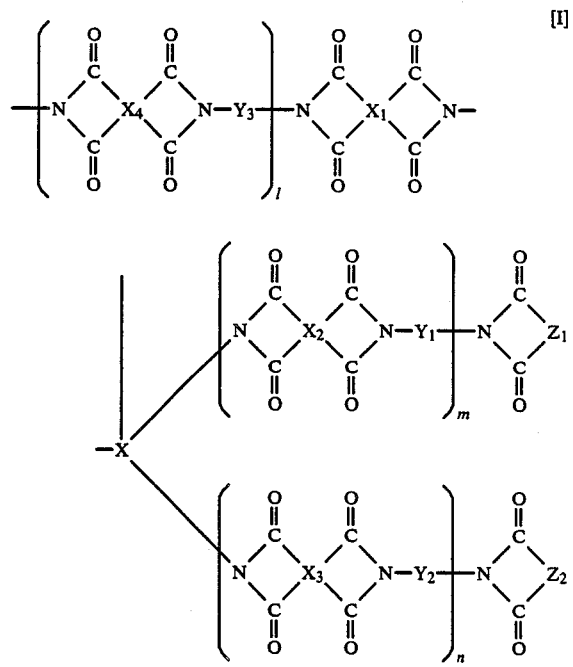

wherein, each of $X$, $X_1$, $X_2$, $X_3$ and $X_4$ is a tetravalent carbocyclic or heterocyclic residue, each of $Y_1$, $Y_2$, and $Y_3$ is a divalent carbocyclic or heterocyclic residue, at least one of $Z_1$ and $Z_2$ is a residue having a reactive carbon-carbon double bond, and each of $l$, $m$, and $n$ is an integer from 0 to 20, preferably from 0 to 10. The polyimide may include (a) polyacrylate compounds (b) bisimide compounds (c) photosensitive polyimide precursors (d) oxime initiators (e) a 3 component sensitizer of a phenone compound, a mercapto compound, and an arylamine-alkanol, or mixtures of a,b,c,d, and e.

34 Claims, No Drawings

TETRAMINE DERIVED POLYIMIDE WITH PENDANT UNSATURATION, AND VARIOUS PHOTOSENSITIVE COMPOSITIONS THEREFROM

BACKGROUND OF THE INVENTION

1. Field of the Invention

The present invention relates to a novel curable composition and more particularly to a light- or heat-curable composition soluble in organic solvents.

In recent years, extensive studies have been made to develop heat-resistant, thermosetting or photosensitive macromolecular materials for use as electronic or optical components. Such components include: surface-protecting films, e.g. junction coatings, passivation films, buffer coatings, and α-ray shielding films; insulation films for semiconductor devices, e.g. insulation films between layers for multilayer circuits; molecular-oriented films for liquid crystal display devices; and insulation films for thin-film magnetic heads or for multilayer printed circuit boards.

2. Description of the Prior Art

A heat-resistant thermosetting composition (Japanese Patent Application Laid-Open No. 179242/82) comprises a polyamide acid or polyamide acid ester that is a polyimide precursor. This composition is used to form, for example, an insulation film between layers in the following manner: A solution of the polyimide precursor is applied on a substrate and dried; a positive type of photoresist is applied on the precursor layer and dried; the photoresist layer is irradiated with actinic rays, such as ultraviolet rays, through a photoresist, and developed together with the polyimide precursor layer by using a basic developing solution; after the photoresist has been developed by using an organic solvent, the whole layer is heated at a temperature of about 400° C. to convert the precursor into the final product polyimide. Heat-resistant photosensitive compositions are also known to shorten the process by requiring no photoresist. Such compositions include, for example, (1) a polymer produced by introducing active functional groups, such as double-bond containing groups, onto the ester side chains of a polyamide acid, which is a polyimide precursor and (2) a composition comprising a mixture of a polyamide acid with an amine compound having an active functional group, such as a double-bond containing group (Japanese Patent Publication Nos. 30207/80 and 41422/80 and Japanese Patent Application Laid-Open Nos. 168942/82 and 145794/79). This type of composition, containing a photosensitizer and a photopolymerizable monomer, is used to form, for example, an insulation film between layers in the following manner: a solution of the composition is applied on a substrate; after drying, the obtained coating is irradiated with actinic rays through a photomask, developed to form an image and imidized by heating at a temperature of about 400° C.

However, the noted prior-art compositions, comprising a polyimide precursor, require heat treatment at a temperature of about 400° C. in order to form a heat-resistant polyimide films or heat-resistant patterns of polyimide. Another drawback of these compositions is the weak adhesion of polyimides to substrates, which results from the large shrinkage of polyimide precursors in the heat treatment. Moreover, these compositions have problems in that the volatile matter present in the precursor tends to produce microvoids in the resulting polyimide film, and the thermal expansion coefficient of the film is still large since the film is not crosslinked.

SUMMARY OF THE INVENTION

Accordingly, it is an object of the present invention to provide a heat-resistant thermosetting composition which does not always require high-temperature imidation treatment has good adhesion between the resulting polyimide and the substrate and yields a resulting polyimide with a satisfactory thermal expansion coefficient.

It is another object of the invention to provide a heat-resistant composition having properties suited to the formation of heat-resistant images or films.

Further objects of the invention will become apparent from the following description.

The present inventors made extensive studies for the purpose of providing a light- or heat-curable composition which need not undergo heat treatment for imidation and is soluble in organic solvents. As a result a composition comprising a polyimide of specific structure was found to meet the objects.

Thus, according to the invention, there is provided a composition comprising (a) a curable polyimide soluble in organic solvents and (b) a polymerization initiator as essential components, said polyimide consisting of recurring units represented by the general formula

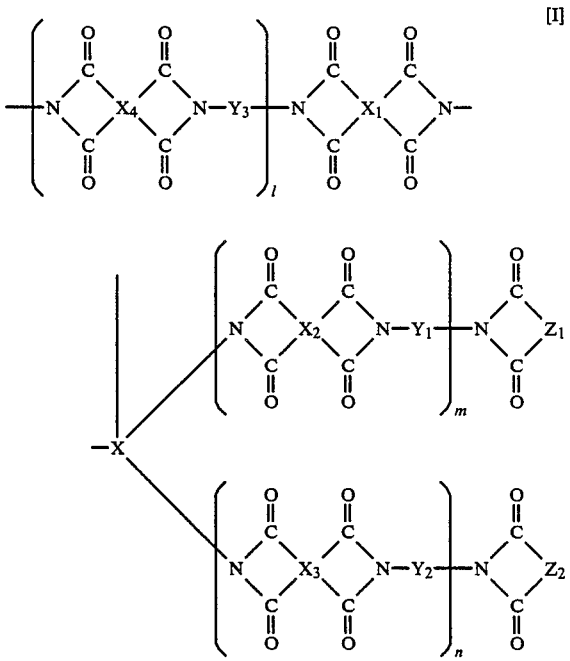

wherein, each of X, $X_1$, $X_2$, $X_3$, and $X_4$ is a tetravalent carbocyclic or heterocyclic residue; each of $Y_1$, $Y_2$, and $Y_3$ is a divalent carbocyclic or heterocyclic residue; at least one of $Z_1$ and $Z_2$ is a residue having a reactive carbon-carbon double bond; and each of l, m, and n is an integer from 0 to 20, preferably from 0 to 10.

The curable polyimide of the present invention has many advantages over the prior art heat-resistant materials. In the first place, one of the advantages is that the addition of any additive, such as a photopolymerization initiator, monomer, or crosslinking agent, is not always necessary for light curing or heat curing and, therefore, it is possible to form heat-resistant films (with limited loss in weight) which are superior in step-coverage and in cross-sectional shape.

Another advantage of the composition is that the polymer having a polyimide skeleton permits marked reduction in strain or remaining stress as compared with that found in prior art compositions of the precursor type imidated by heating.

Exhibiting these advantages, the curable composition of the present invention forms films or images superior in heat resistance when used for semiconductor passivation films, α-ray shielding films, flexible printed circuit boards, insulation films between layers of multilayer circuit boards, solar cell insulation films, magnetic tapes, magnetic disk base materials, coil insulation films, carrier tapes in IC or LSI production, LSI layer insulating or surface protecting films, etc.

DESCRIPTION OF THE PREFERRED EMBODIMENTS

The polyimide used as component (a) in the composition of the present invention contains structural units represented by the above general formula [I], wherein X is desired to be a residue represented by the formula

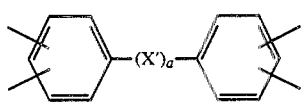
(Xa)

wherein a is 0 or 1 and X' is

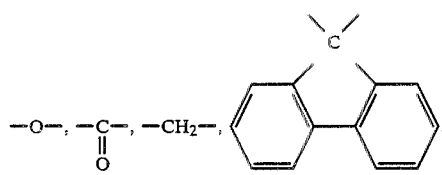

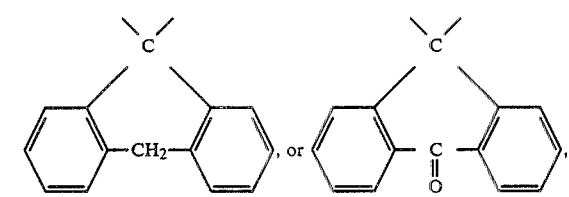

among which a=0 and X'=—O— are preferred. That is, X is preferred to be

X(A)

or

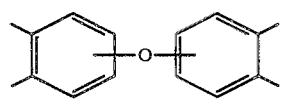
X(B)

$X_1$, $X_2$, $X_3$, and $X_4$ in formula [I] are preferably aromatic hydrocarbon residues of 6 to 20 carbon atoms or residues represented by the formula

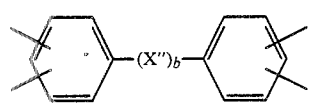
(Xb)

wherein b is 0 or 1 and X'' is —CH$_2$—,

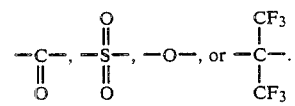

Preferably each of $X_1$, $X_2$, $X_3$ and $X_4$ is

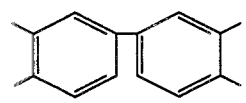
X(D)

and particularly

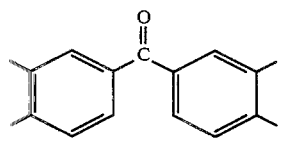
X(C)

in the aspect of the photosensitivity of the composition.

Each reference to a heterocyclic residue is unlimited, virtually any heterocyclic residue is suitable. The simpler residues, those having from 5 to 20 ring members and at most two hetero ring members in any ring, are preferred, particularly those wherein any hetero ring member is O, N or S. The heterocyclic residue is aromatic, e.g. that of pyridine, pyrimidine or thiophene, or cycloaliphatic, e.g. that of morpholine or pyrroline, and can comprise plural condensed rings, e.g. that of indolizine or indoline. Each ring of a heterocyclic residue preferably has five or six ring members.

Each reference to a carbocyclic residue includes structures having one or more, condensed or non-condensed, rings, each of which is preferably of five or six ring members. When a carbocyclic residue comprises more than one ring, each is, independently, saturated, unsaturated or partially unsaturated. Each carbocyclic residue preferably has from five to twenty ring carbon atoms. Examples of carbocyclic residues include those of benzene, naphthalene and anthracene and their partially or wholly saturated counterparts.

The polyimide used as component (a) in the composition of the present invention is desired to have, as the residue having a carbon-carbon double bond, that is, as the residue represented by at least one of $Z_1$ and $Z_2$ in formula [I], a residue selected from

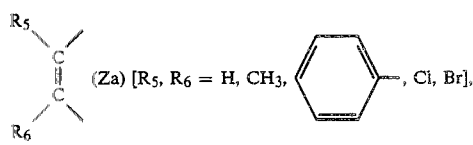

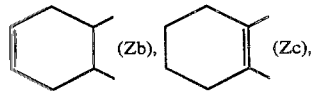

-continued

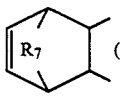 (Zd) [R$_7$ = O, (CH$_2$)$_3$],

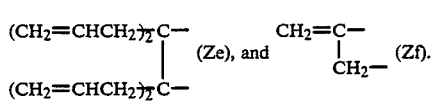 (Ze), and (Zf).

Of these residues, the following Z(A) and Z(B) are preferred and the Z(C) is particularly preferred:

 Z(A)

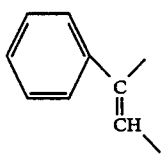 Z(B)

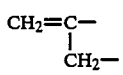 Z(C)

By introducing said residue having a carbon-carbon double bond as at least one of Z$_1$ and Z$_2$, it is possible to afford heat-curability and light-curability to the polyimide used as component (a).

Of the residues Z$_1$ and Z$_2$, one having no reactive carbon-carbon double bond is desirably an aromatic hydrocarbon residue of 6 to 30 carbon atoms, preferably one member selected from

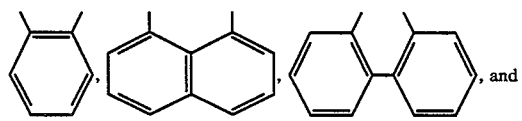 , and

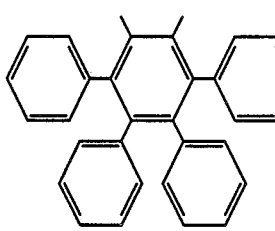

A composition of higher heat resistance can be obtained by using a polyimide of formula (I) wherein l, m, and n are all 0.

Further, a more photosensitive composition can be obtained by using a polimide of formula (I) wherein Y$_1$, Y$_2$, and Y$_3$ are residues represented by the formula

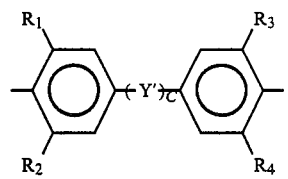 (Ya')

wherein, C is 0 or 1, Y' is —CH$_2$—,

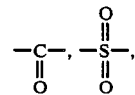

—O—, or —S—, each of R$_1$ and R$_3$ is alkyl of 1 to 6 carbon atoms, and each of R$_2$ and R$_4$ is hydrogen or alkyl of 1 to 6 carbon atoms.

Examples of Y' are residues represented by the formula

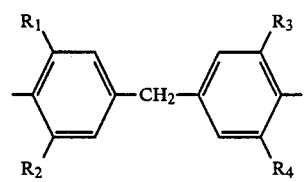

wherein each of R$_1$ and R$_3$ is —CH$_3$, —CH$_2$CH$_3$, or —CH(CH$_3$)$_2$ and each of R$_2$ and R$_4$ is —H, —CH$_3$, —CH$_2$CH$_3$, or —CH(CH$_3$)$_2$, and any of R$_1$ to R$_4$ is preferred to be —CH$_2$CH$_3$ in view of the photosensitivity.

A composition having higher storage stability can be obtained by using a polyimide of formula [I] wherein Y$_1$, Y$_2$, and Y$_3$ are all represented the formula

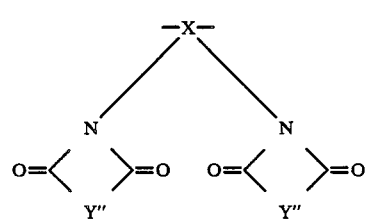 (Yb)

wherein X is as defined above and Y" is an aromatic hydrocarbon residue of 6 to 30 carbon atoms.

Examples of Yb are

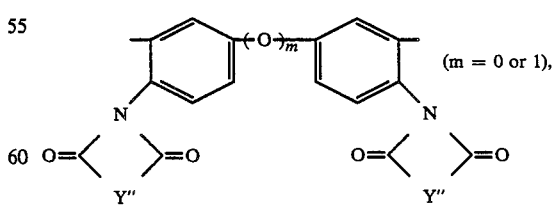 (m = 0 or 1),

Y" = 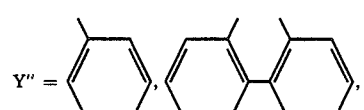 ,

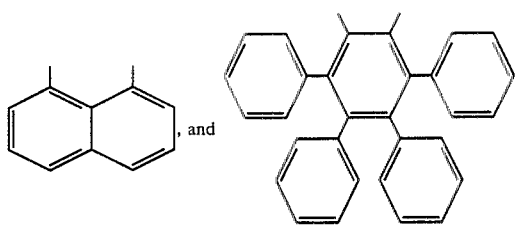

A composition more photosensitive can be obtained by adding further thereto a compound having a reactive carbon-carbon double bond.

Such double-bond containing compounds include, for example, 2-ethylhexyl acrylate, 2-hydroxyethyl acrylate, N-vinyl-2-pyrrolidone, carbitol acrylate, tetrahydrofurfuryl acrylate, isobornyl acrylate, 1,6-hexanediol diacrylate, neopentyl glycol diacrylate, ethylene glycol diacrylate, polyethylene glycol diacrylate, pentaerythritol diacrylate, trimethylolpropane triacrylate, pentaerythritol triacrylate, dipentaerythritol hexaacrylate, tetramethylolmethane tetraacrylate, tetraethylene glycol diacrylate, nonaethylene glycol diacrylate, methylene bisacrylate, N-methylol acrylamide, and products of substituting methacryl for the acryl of these compounds. Of the above-cited compounds, preferred are polyacrylates that have plural acryloyloxy groups and particularly preferred are compounds represented by the formula

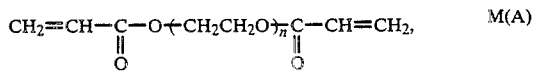

for example, tetraethylene glycol diacrylate, in view of the photosensitivity.

The heat-curable composition of the present invention may comprise further an imide compound represented by the formula

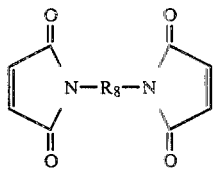

wherein $R_8$ is an organic residue containing no reactive carbon-carbon double bond.

Such imide compounds include, for example, N,N'-4,4'-diphenylmethanebismaleimide, N,N'-hexamethylenebismaleimide, N,N'-m-phenylenebismaleimide, N,N'-p-phenylenebismaleimide, N,N'-4,4'-diphenyletherbismaleimide, and N,N'-diphenylsulfonebismaleimide.

Moreover, the composition of the present invention may comprise further a photosensitive polyimide precursor. This photosensitive polyimide precursor is exemplified by polymers having recurring units represented by the formula

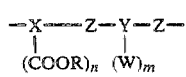

wherein X is a (2+n)-valent carbocyclic or heterocyclic residue; Y is a (2+m)-valent carbocyclic or heterocyclic residue; Z is

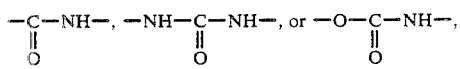

R is hydrogen or a hydrocarbon residue, W is a residue which (on heating) reacts with the carbonyl group of the (COOR) to liberate ROH and form a ring; n is 1 or 2; m is 0, 1, or 2, and the COOR and Z are at positions ortho or peri to each other.

The following are non-limiting examples of X and Y:

X is a tetravalent carbocyclic or heterocyclic residue. Examples of X are a benzene ring; a condensed polycyclic ring such as a naphthalene ring, anthracene ring or the like; a heterocyclic residue, such as pyridine, thiophene or a residue having one of the following formulae:

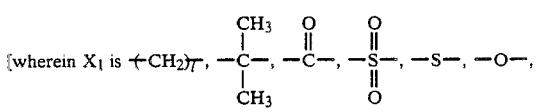

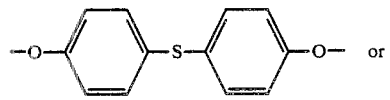

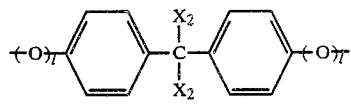

(wherein l is 0 or 1) and $X_2$ is —$CH_3$ or —$CF_3$. Of those residues, an aromatic hydrocarbon of from 6 to 14 carbon atoms and, a residue of the formula [II$_1$] wherein $X_1$ is —$(CH_2)_l$— (wherein l is 0 or 1),

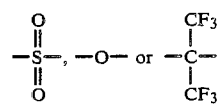

are preferred, and a residue of one of the formulae [II$_2$] and [II$_3$]

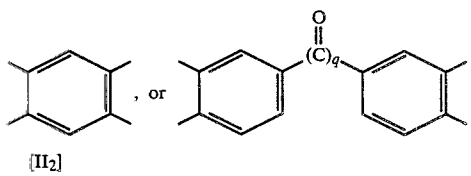

(wherein q is 0 or 1) [II$_3$] is more preferred.

Y in formula [III] is, e.g.,

Y a di, tri or tetravalent carbocyclic or heterocyclic residue. Examples of Y are a divalent aromatic hydrocarbon ring having 10 to 18 carbon atoms, such as a naphthalene ring, anthracene ring or the like; a heterocyclic ring derived from pyridine, imidazole or the like; and a residue represented by the formulae

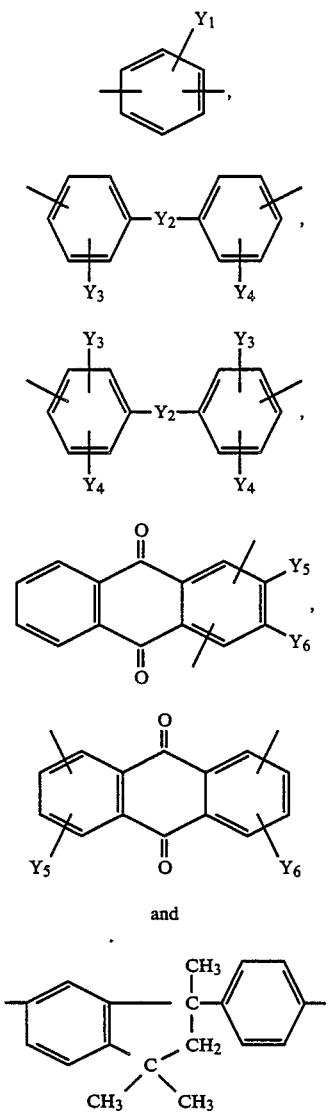

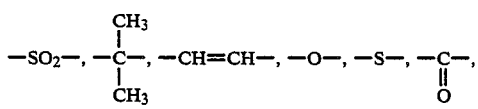

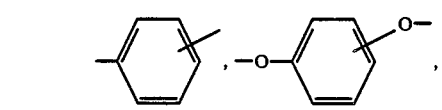

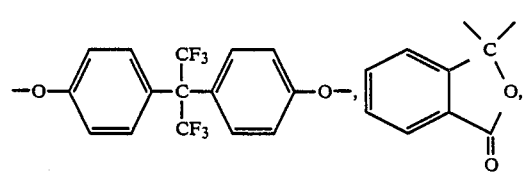

[wherein $Y_1$ in the aforementioned formulae is —H, —CH$_3$, (CH$_3$)$_2$CH—, —OCH$_3$, —COOH, a halogen atom or —SO$_3$H; $Y_2$ in the aforementioned formulae is —(CH$_2$)$_p$— (in which p is 0 or 1, $$-SO_2-, -\overset{CH_3}{\underset{CH_3}{C}}-, -CH=CH-, -O-, -S-, -\overset{O}{\underset{\|}{C}}-,$$

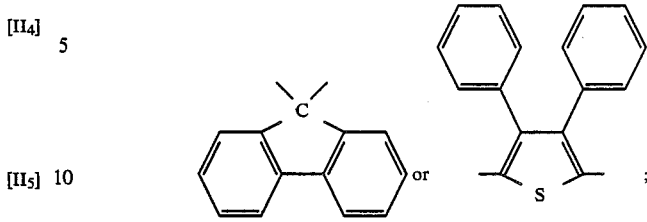

-continued each of $Y_3$ and $Y_4$ in the aforementioned formulae is —H, —CH$_3$, —C$_2$H$_5$, —OCH$_3$, a halogen atom, —COOH, —SO$_3$H or —NO$_2$; and each of $Y_5$ and $Y_6$ is —H, —CN, a halogen atom, —CH$_3$, —OCH$_3$, —SO$_3$H or —OH].

Of those residues, a divalent aromatic hydrocarbon ring having 10-14 carbon atoms and a residue represented by the formula [II$_4$], [II$_5$] or [II$_5$'], wherein $Y_2$ is —(CH$_2$)$_p$— (in which p is 0 or 1), $$-\overset{O}{\underset{\|}{C}}-,$$

—SO$_2$—, —O— or —S—; and each of $Y_3$ and $Y_4$ is a hydrogen atom, are preferred, and those represented by the following formula are more preferred:

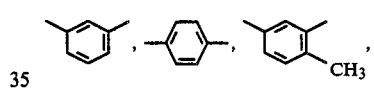

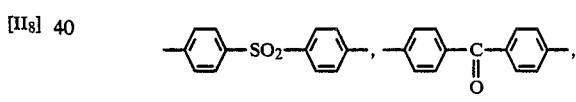

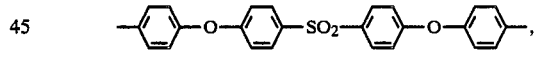

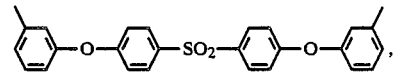

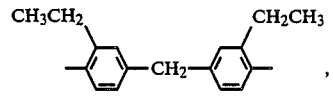

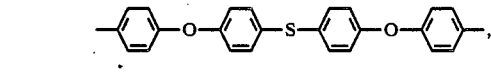

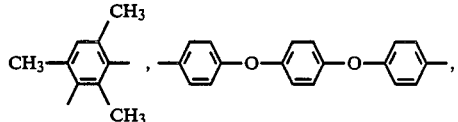

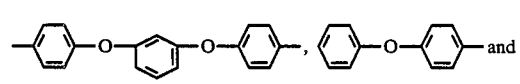

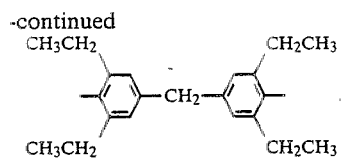

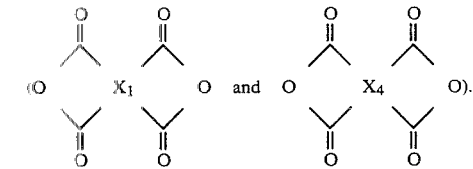

Preferred examples of the photosensitive polyimide precursor are polymers (each consisting of recurring units) represented by the following formula [III$_1$], [III$_2$], or [III$_3$]:

This reaction proceeds as shown by the following equation (II-A). Suitable solvents for this reaction are aprotic polar liquids, for example, dimethylformamide

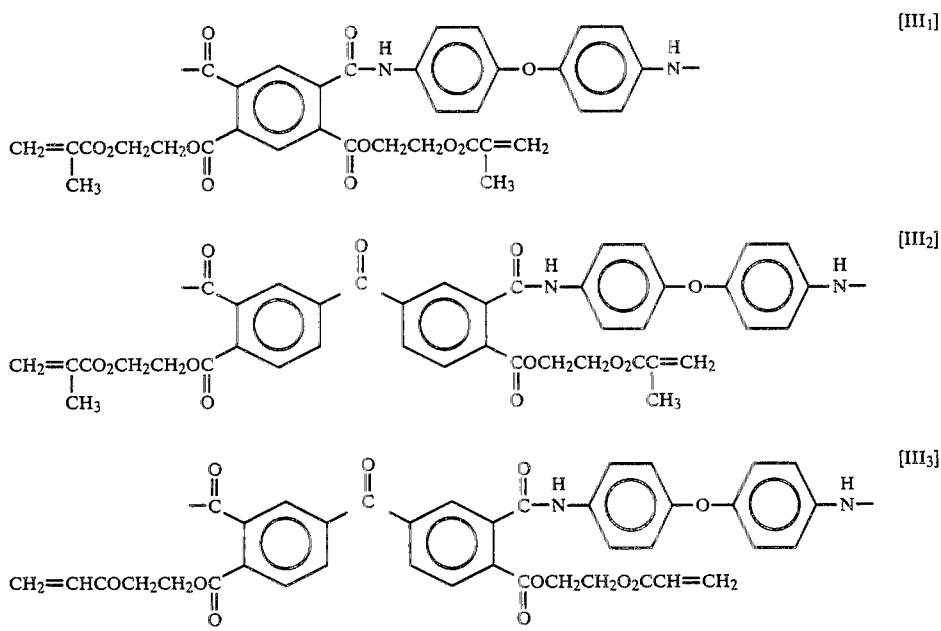

Description is given below of a typical process for synthesizing the polyimide which is component (a) of the present composition.

First a polyamic acid is prepared by reaction of starting materials, that is, by reacting a tetramine compound X(NH$_2$)$_4$ and a diamine compound Y$_3$(NH$_2$)$_2$ with tetracarboxylic anhydrides (DMF), hexamethylphosphorotriamide, N-methylpyrrolidone (NMP), dimethylacetamide, tetrahydrofuran, and γ-butyrolactone. The reaction is carried out at a temperature of −10° to 60° C., preferably 10° to 30° C., for a period of 1 to 24 hours, preferably 1 to 6 hours, under continuous stirring.

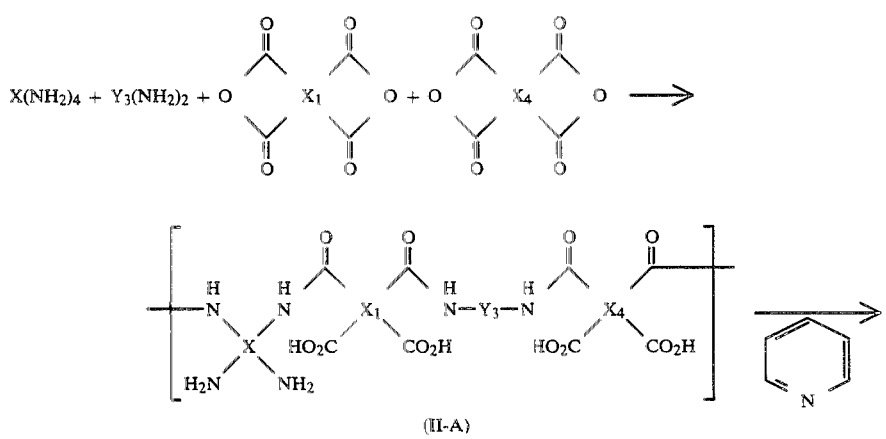

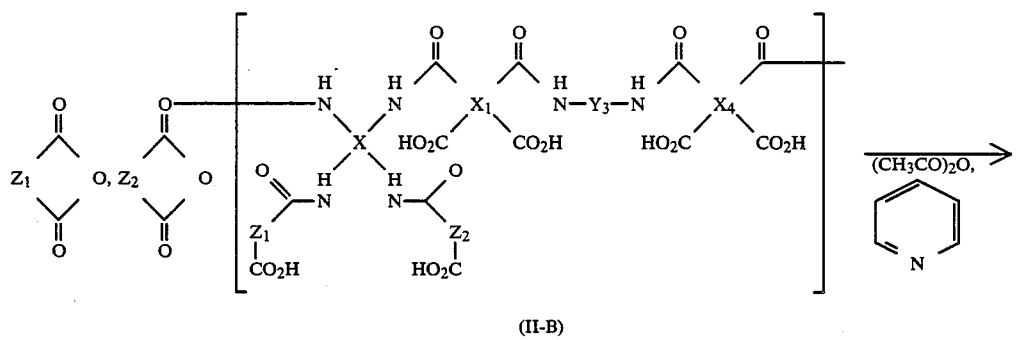

(II-B)

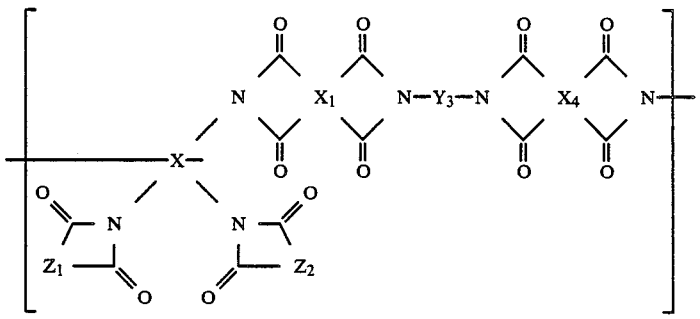

(II-C)

Then acid anhydrides

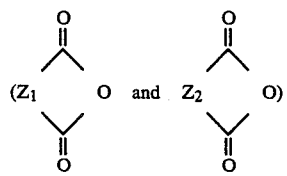

together with an organic base are added to react with the unreacted amino groups [equation II-B]. Examples of this organic base are pyridine, triethylamine, picoline, 3,5-lutidine, isoquinoline, 3- or 4-methylpyridine, and N-methylmorpholine, among which pyridine is preferred. The conditions of this reaction are equal to those of reaction (II-A).

The thus obtained polyamic acid is then imidized by adding acetic anhydride and the same organic base as used for reaction (II-B). This reaction is carried out at a temperature of 10° to 150° C., preferably 20° to 80° C., for a period of 1 to 12 hours, preferably 1 to 4 hours, under continuous stirring. The product polymer is isolated by dropping the resultant solution in water or an alcohol, such as methanol, ethanol, isopropanol, or Solmix (mixture of ethanol 87 vol. % and isopropanol 13 vol. %), to precipitate, and washing or, if necessary, dissolving the precipitate in a solvent, followed by reprecipitation. Examples of the solvent are cyclopentanone, cyclohexanone, tetrahydrofuran (THF), and γ-butyrolactone, among which THF is preferred.

One type of polymerization initiator used as component (b) of the composition according to the present invention is a generally known photopolymerization initiator, examples of which are as follows:

2-ethylanthraquinone, 2-t-butylanthraquinone, 1,2-benzanthraquinone, 2,3-diphenylanthraquinone, benzil, benzophenone, valerophenone, γ-phenylbutyrophenone, dibenzosuberone, 4-morpholinobenzophenone, benzoin, α-phenylbenzoin, 10-thioxanthenone, 2-acetylphenanthrene, 3-acetylindole, 9-fluorenone, 1-indanone, thioxanthene-9-one, benzanthrone, 2,6-di(4'-diazidobenzal)cyclohexanone, and oxime type initiators including 1-phenyl-1,2-butanedione-2-(o-methoxycarbonyl)oxime, 1-phenylpropanedione-2-(o-ethoxycarbonyl)oxime, 1-phenylpropanedione-2-(o-benzoyl)oxime, 1,2-diphenylethanedione-1-(o-benzoyl)oxime, and 1,3-diphenylpropanetrione-2-(o-ethoxycarbonyl)oxime. In view of photosensitivity, oxime type initiators and particularly 1,3-diphenylpropanetrione-2-(o-ethoxycarbonyl)oxime are preferable.

Another type of polymerization initiator used as component (b) of the composition according to the present invention is a thermal polymerization initiator, examples of which include benzoyl peroxide, azobisisobutyronitrile, cumene hydroperoxide, and t-butyl hydroperoxide, though not limited to these.

The proportion of the polymerization initiator used as component (b) in the composition of the present invention is desirably from 0.1 to 15%, preferably from 0.1 to 10%, by weight based on the polyimide used as component (a). Similar proportions are suited for the photosensitizer. The proportion of the compound having a reactive carbon-carbon double bond is desired to be up to 20% by weight based on the polyimide used as component (a). The photosensitive polyimide precursor is used desirably in a proportion of up to 50% by weight based on the polyimide.

An ordinary sensitizer can be added to the composition of the present invention, whereby the photosensitivity of the composition can be increased. Such sensitizers include; bis(dialkylamino)benzophenones, e.g. Michler's ketone and 4,4'-bis(diethylamino)benzophenone; other ketones, e.g. 2,5-bis(4'-diethylaminobenzal)cyclopentanone, 2,6-bis(4'-diethylaminobenzal)cyclohexanone, 2,6-bis(4'-dimethylaminobenzal)-4- methylcyclohexanone, 2,6-bis(4'-diethylaminobenzal)-4-methylcyclohexanone, 4,4'-bis(dimethylamino)chalcone, 4,4'-bis(diethylamino)chalcone, p-dimethylaminocinnamylideneindanone, p-dimethylaminobenzylideneindanone, 2-(p-dimethylaminophenylvinylene)benzothiazole, 2-(p-dimethylaminophenylvinylene)isonaphthothiazole, 1,3-bis(4'-dimethylaminobenzal)acetone, 1,3-bis(4'-diethylaminobenzal)acetone, and 3,3'-carbonylbis(7-diethylaminocoumarin); ethanolamine derivatives represented by the following formula S(A); and mercapto-containing aromatic heterocyclic compounds.

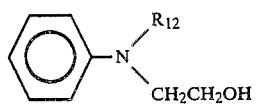

In this formula, $R_{12}$ is hydrogen, an aliphatic residue which may have hydroxyl, or an aromatic residue.

The ethanolamine derivatives include, for example, N-phenyldiethanolamine, N-phenylethanolamine, and N-phenyl-N'-ethylethanolamine. The mercapto-containing aromatic heterocyclic compounds include, for example, 2-mercaptobenzimdazole, 2-mercaptobenzothiazole, and 1-phenyl-5-mercapto-1H-tetrazole. Of these sensitizers, preferred are combinations of a bis(dialkylamino)benzophenone, ethanolamine derivative, and mercapto-containing aromatic heterocyclic compound and particularly preferred are combinations of 4,4'-bis(diethylamino)benzophenone, 1-phenyl-5-mercapto-1H-tetrazole, and N-phenylethanolamine.

When the composition of the present invention is used, a solvent is necessary to dissolve the composition. Desirably this solvent is a polar organic compound having a boiling point of up to 250° C. Such solvents include, for example, dimethylformamide, N-methylpyrrolidone, dimethylacetamide, cyclopentanone, γ-butyrolactone, and mixtures thereof. Additional use is possible of a second organic solvent, such as an alcohol, aromatic hydrocarbon, ether, or ester, so far as it does not precipitate any component of the composition.

Heat-resistant images or layers are formed from the composition of the present invention in the following manner: A solution of the composition is applied on a substrate, such as a silicon wafer by means of a spin coater or the like, and dried at a temperature of 40° to 150° C., preferably 60° to 100° C. For thermal curing, the coating is heat-treated at a temperature of 200° to 500° C., preferably 250° to 450° C. This makes the coating insoluble in any of the above-mentioned polar solvents and raises the thermal decomposition point of the coating. For light curing, the dried coating is exposed to light from an ultrahigh-pressure mercury lamp or the like through a photomask, then developed by using a developer consisting of the above-cited polar organic solvent, and rinsed with a solvent, such as the above-cited second solvent. The developed pattern of coating is further heat-cured, thereby improving the pattern in heat resistance.

The composition of the present invention can also be used to form films in the following manner: A solution of the composition is applied on a prescribed support by means of a bar coater, blade coater, or the like and then dried to form a film. This film is used together with the support or a peelable protecting film or in single form after separation from the support.

The solution of the composition can be prepared by dissolving it in a solvent, e.g. cyclopentanone or cyclohexanone. The support is desired to be a clear and sufficiently strong material insoluble in the solvent to use. Polyethylene terephthalate films, polypropylene films, etc., can be used for the support. A similar film is desirable for use as the protecting film. The drying of the applied solution is conducted at a temperature of 40° to 100° C., preferably 50° to 80° C., for a period of 5 to 60 minutes, preferably 20 to 40 minutes. The formed film may be laminated on a substrate by heating under pressure. The lamination is better carried out by using a hot-roll laminator under conditions of a roll temperature of 40° to 200° C., particularly 70° to 150° C., and a roll pressure of 0.5 to 5 Kg/cm², particularly 1 to 3 Kg/cm².

The heat curing as well as the light curing of the film are carried out in the same manner as stated above.

The following examples and reference examples illustrate the present invention in more detail. However, the invention is not restricted to these examples.

Reference Example 1

A solution of 16.1 g of 3,3',4,4'-benzophenonetetracarboxylic dianhydride in 116 ml of DMF was added dropwise to a solution of 10.7 g of 3,3'-diaminobenzidine in 96 ml of DMF over 3 hours with stirring while cooling with ice. After 2-hour stirring of the mixture at 25° C., 11.1 g of phthalic anhydride, 2.9 g of maleic anhydride and 6.5 ml of pyridine were added and the mixture was stirred at 25° C. for 20 hours. To the resulting polyamic acid solution were added 37.8 ml of acetic anhydride and 25.8 ml of pyridine. The mixture was stirred at 40° C. for 3 hours to imidize the polyamic acid. The resulting solution was added dropwise to 3 l of water under stirring to precipitate a polymer, which was then filtered, washed three times with 3 l each of water, and dried in vacuo. The obtained polymer (yield 67%) is designated as P-1.

$[\eta] = 0.34$ (C=1% in NMP, 30° C.).

IR absorption spectrum: 1790 cm$^{-1}$ (assigned to imide bonds), 1505 cm$^{-1}$ (assigned to maleimido groups).

NMR spectrum ($^1$H, 100 MHz): 6.8 ppm (2H of maleimido groups), 7-8.6 ppm (36H of aromatic groups).

Anal. Calcd.: C, 67.9; H, 2.8; O, 21.7; N, 7.6. Found: C, 70.2; H, 2.6; O, 19.6; N, 7.6.

Reference Example 2

A polymer (P-2) was prepared by following the procedure of Reference Example 1 but using 13.3 g of phthalic anhydride and 0.98 g of maleic anhydride in place of 11.1 g of phthalic anhydride and 2.5 g of maleic anhydride (yield 64%).

$[\eta] = 0.32$.

IR absorption spectrum: Identical with that of P-1.

NMR spectrum: 6.8 ppm (2H of maleimido groups), 7-8.6 ppm (96H of aromatic groups).

Anal. Calcd.: C, 68.5, H, 2.8; O, 21.3; N, 7.4. Found: C, 70.7; H, 2.6; O, 19.2; N, 7.5.

Reference Example 3

A polymer (P-3) was prepared by following the procedure of Reference Example 1 but using 16.8 g of diphenic anhydride and 2.5 g of maleic anhydride in place of 11.1 g of phthalic anhydride and 2.5 g of maleic anhydride (yield 68%).

[η]=0.42.

IR absorption spectrum: Nearly identical with that of P-1.

NMR spectrum: 6.8 ppm (2H of maleimido groups), 7-8.6 ppm (48H of aromatic groups).

Anal. Calcd.: C, 71.5; H, 3.1; O, 18.8; N, 6.6. Found: C, 73.5; H, 2.9; O, 17.0; N, 6.6.

Reference Example 4

A polymer (P-4) was prepared by following the procedure of Reference Example 1 but using 13.5 g of 3,3',4,4'-benzophenonetetracarboxylic dianhydride and 4.35 g of phenylmaleic anhydride in place of 16.1 g of 3,3',4,4'-benzophenonetetracarboxylic dianhydride and 2.5 g of maleic anhydride (yield 71%).

[η]=0.43.

IR absorption spectrum: Nearly identical with that of P-1.

NMR spectrum: 6.8 ppm (2H at α-position of maleimido groups), 7-8.6 ppm (106H of aromatic groups).

Anal. Calcd.: C, 72.4; H, 2.9; O, 17.0; N, 7.7. Found: C, 79.9; H, 3.3; O, 16.4; N, 6.4.

Reference Example 5

A polymer (P-5) was prepared by following the procedure of Reference Example 1 but using 11.5 g of 3,3',4,4'-tetraaminobiphenyl ether and 10.9 g of pyromellitic anhydride in place of 10.7 g of 3,3'-diaminobenzidine and 16.1 g of 3,3',4,4'-benzophenonetetracarboxylic dianhydride (yield 67%).

[η]=0.32.

IR absorption spectrum: Nearly identical with that of P-1.

NMR spectrum: 6.8 ppm (2H of maleimido groups), 7-8.6 ppm (28H of aromatic groups).

Anal. Calcd.: C, 66.7; H, 2.3; O, 22.3; N, 8.7. Found: C, 66.1; H, 2.4; O, 22.7; N, 8.8.

Reference Example 6

A solution of 9.3 g of 4,4'-methylenebis(2,6-diethylaniline) in 57.6 ml of DMF was added to a solution of 4.85 g of 3,3',4,4'-benzophenonetetracarboxylic dianhydride in 43.6 ml of DMF with stirring at 25° C. After 1 hour stirring of the mixture at 25° C., 0.55 g of maleic anhydride, 0.63 g of itaconic anhydride, and 1 ml of pyridine were added and the mixture was stirred at 25° C. for 1 hour. Further, 6.06 g of 3,3',4,4'-benzophenonetetracarboxylic dianhydride and 1 ml of pyridine were added, the mixture was stirred at 25° C. for 1 hour, then 1.08 g of 3,3',4,4'-tetraaminobiphenyl ether and 1 ml of pyridine were added, and the mixture was stirred at 25° C. for 4 hours and left standing for 16 hours. To the resulting polyamide acid solution were added 14.2 ml of acetic anhydride and 9.7 ml of pyridine. The mixture was stirred at 40° C. for 3 hours to imidize the polyamic acid. The resulting solution was added dropwise to 3 l of water under stirring to precipitate a polymer, which was then filtered, washed three times with 3 l each of water, and dried in vacuo. The obtained polymer (yield 71%) is designated as P-6.

[η]=0.3.

IR absorption spectrum: 2900-3000 cm$^{-1}$ (ethyl groups), 1790 cm$^{-1}$ (imide bonds), 1400-1600 cm$^{-1}$ (maleimido groups and itaconimido groups).

NMR spectrum: 1.1 ppm (48H of methyl groups), 2.5 ppm (41H of methylene groups), 6.3 ppm (2H of itaconimido groups), 6.8 ppm (2H of maleimido groups), 7-8.6 ppm (40H of aromatic groups), Anal. Calcd.: C, 62.5; H, 4.5; O, 28.5; N, 4.5. Found: C, 62.8; H, 4.5; O, 28.3; N, 4.3.

Reference Example 7

A polymer (P-7) was prepared by following the procedure of Reference Example 1 but using 11.2 g of diphenic anhydride and 5.6 g of itaconic anhydride in place of 11.1 g of phthalic anhydride and 2.5 g of maleic anhydride (yield 69%).

[η]=0.42.

IR absorption spectrum: 1790 cm$^{-1}$ (imide bonds), 1400-1600 cm$^{31\ 1}$ (itaconimido groups).

NMR spectrum: 2.5 ppm (2H of methylene groups), 6.3 ppm (2H of terminal olefin groups), 7-8.6 ppm (20H of aromatic groups).

Anal. Calcd.: C, 69.9; H, 3.1; O, 20.0; N, 7.0. Found: C, 70.3; H, 2.9; O, 20.1; N, 6.7.

EXAMPLE 1

A solution was prepared by dissolving 10 g of P-1, 0.2 g of benzophenone, and 0.1 g of Michler's ketone in 40 g of N-methylpyrrolidone (NMP). This solution was applied on silicon wafers by means of a spin coater, and dried to form a 3μ thick coating on each wafer. Some of the coatings, covered with photomasks, were each exposed for 10 minutes to light from an ultrahigh-pressure mercury lamp (output 8 mW/cm$^2$), then treated with a developing mixture of γ-butyrolactone and xylene (volume ratio 1:1), and rinsed with xylene, forming spar patterns. On heat treatment at 400° C. for 1 hour, these patterns of coating became 2.6μ thick. The unexposed coatings heat-treated at 400° C. for 1 hour showed a 5% weight loss temperature of 470° C. The above coating solution of P-1 was stable at 40° C. for 14 days or more without any gelation.

EXAMPLE 2

A solution was prepared by dissolving 10 g of P-6, 0.6 g of 1,3-diphenylpropanetrione-2-(O-ethoxycarbonyl)oxime, 0.2 g of 4,4'-bis(diethylamino)benzophenone, 0.1 g of 1-phenyl-5-mercapto-1H-tetrazole, and 0.2 g of N-phenyldiethanolamine in 40 g of NMP. The solution was applied on silicon wafers by means of a spin coater, and dried to form a 2μ thick coating on each wafer. Some of the coatings, covered with photomask, were each exposed for 5 minutes to light from an ultrahigh-pressure mercury lamp (output 8 mW/cm$^2$), then treated with a developing mixture of γ-butyrolactone and xylene (volume ratio 1:2), and rinsed with xylene, forming shape patterns. On heat treatment at 400° C. for 1 hour, these patterns of coating became 1.6μ thick. The unexposed coatings heat-treated at 400° C. for 1 hour showed a 5% weight loss temperature of 450° C.

EXAMPLE 3

The same materials as used in Example 2 were dissolved in 40 g of cyclopentanone. This solution was applied to a 25μ thick polyethylene terephthalate (PET) film by means of an automatic applicator (supplied by Toyo Seiki Seisakujo Co., Ltd.), and dried at 70° C. for 20 minutes to form a 5μ thick film. This supported film was applied to coat silicon wafers by using a hot roll liminator (150° C., 2 Kg/cm$^2$). After allowing to cool, the supporting PET film was peeled off, and the coating film on each silicon wafer, covered with a photomask, was exposed for 5 minutes to light from an ultrahigh-pressure mercury lamp (output 8 mW/cm²). Development and rinsing the exposed coatings in the same manner as in Example 2 gave sharp patterns. On heating at 400° C. for 1 hour, these patterns of coating became 4μ thick.

EXAMPLE 4

A solution was prepared by dissolving 10 g of P-7, 0.2 g of benzophenone, and 0.1 g of Michler's ketone in 40 g of NMP. This solution was applied on silicon wafers by means of a spin coater, and dried to form a 3-μ thick coating on each wafer. Some of the coatings, covered with photomasks, were each exposed for 8 minutes to light from the above-mentioned ultrahigh-pressure mercury lamp, then developed and rinsed in the same manner as in Example 1, forming sharp patterns. On heat treatment at 400° C. for 1 hour, these patterns of coating became 2.4μ thick. The unexposed coatings heat-treated at 400° C. for 1 hour showed a 5% weight loss temperature of 450° C.

Comparative Example 1

A polymer (P-8) was prepared by following the procedure of Reference Example 1 but using 22.4 g of diphenic anhydride in place of 11.1 g of phthalic anhydride and 2.5 g of maleic anhydride (yield 72%). The inherent viscosity of P-8 was 0.24 and P-8 showed an IR absorption peak at 1790 cm⁻¹ assigned to imide bonds.

Anal. Calcd.: C, 73.2; H, 3.2; O, 17.5; N, 6.1. Found: C, 73.0; H, 3.4; O, 17.3; N, 6.3. a solution of 10 g of P-8, 0.2 g of benzophenone, and 0.1 g of Michler's ketone in 40 g of NMP was applied on silicon wafers by means of a spin coater, and dried to form a 3μ thick coating on each wafer. These coatings were exposed to light and developed in the same manner as in Example 1, but no pattern formation was observed.

What is claimed is:

1. A composition comprising (a) a curable polyimide soluble in organic solvents and (b) a photopolymerization initiator as essential components, said polyimide consisting of recurring units represented by the formula

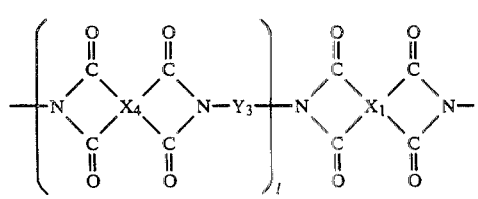

[I]

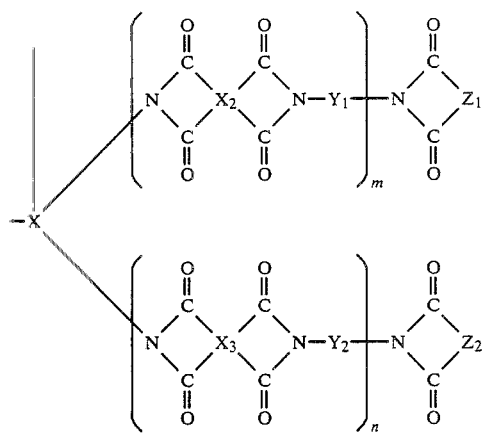

wherein,
each of X, $X_1$, $X_2$, $X_3$, and $X_4$ is a tetravalent carbocyclic or heterocyclic residue,
each of $Y_1$, $Y_2$, and $Y_3$ is a divalent carbocyclic or heterocyclic residue,
each of $Z_1$ and $Z_2$ is an aromatic hydrocarbon residue of from 6 to 30 carbon atoms or a residue having a reactive carbon-carbon double bond, at least one of $Z_1$ and $Z_2$ is a residue having a reactive carbon-carbon double bond, and
each of l, m, and n is an integer from 0 to 20.

2. A curable composition of claim 1, wherein X in formula [I] is a residue represented by the formula

(Xa)

wherein a is 0 or 1 and X' is

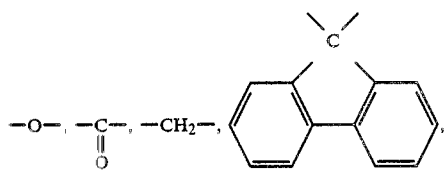

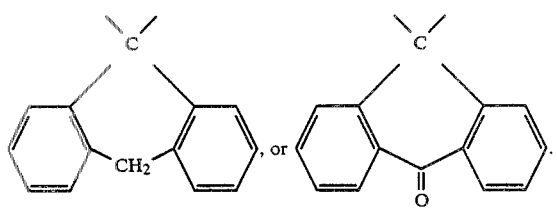

3. A curable composition of claim 2, wherein X in formula [I] is a residue represented by the following formula X(A) or X(B):

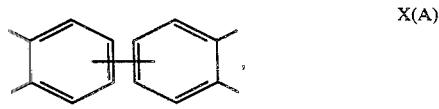

X(A)

-continued

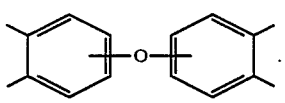 (X(B))

4. A curable composition of claim 1, wherein each of $X_1$, $X_2$, $X_3$, and $X_4$ in formula [I] is an aromatic hydrocarbon residue of 6 to 20 carbon atoms or a residue represented by the formula

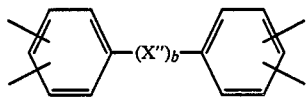 (Xb)

wherein b is 0 or 1 and X" is —CH$_2$—,

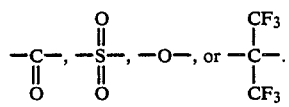

5. A curable composition of claim 4, wherein each of $X_1$, $X_2$, $X_3$, and $X_4$ in formula [I] is a residue represented by the following formula X(C) or X(D):

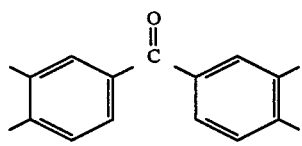 (X(C))

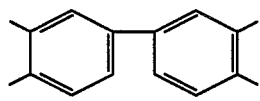 (X(D))

6. A curable composition of claim 5, wherein each of $X_1$, $X_2$, $X_3$, and $X_4$ in formula [I] is the residue of formula X(C).

7. A curable composition of claim 6, wherein at least one of $Z_1$ and $Z_2$ in formula [I] is a residue represented by the following formula (Za) to (Zf):

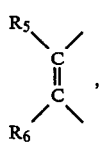 (Za)

wherein each of $R_5$ and $R_6$ is H, CH$_3$,

Cl—, Br;

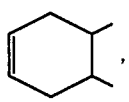 (Zb)

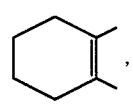 (Zc)

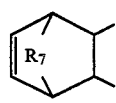 (Zd)

wherein $R_7$ is —O— or —(CH$_2$)$_3$—,

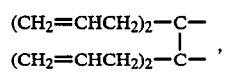 (Ze)

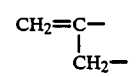 (Zf)

8. A curable composition of claim 7, wherein at least one of $Z_1$ and $Z_2$ in formula [I] is a residue represented by the following formula Z(A), Z(B), or Z(C):

 Z(A)

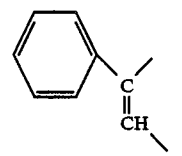 Z(B)

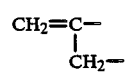 Z(C)

9. A curable composition of claim 8, wherein at least one of $Z_1$ and $Z_2$ in formula [I] is the residue of formula Z(C).

10. A curable composition of claim 1, wherein $Z_1$ or $Z_2$, in formula [I], having no reactive carbon-carbon double bond, is an aromatic hydrocarbon residue of 6 to 30 carbon atoms.

11. A curable composition of claim 10, wherein $Z_1$ or $Z_2$, in formula [I], having no reactive carbon-carbon double bond, is a residue represented by one of the following formulae Z(A) to Z(D):

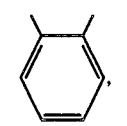 Z(A)

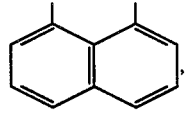 Z(B)

-continued

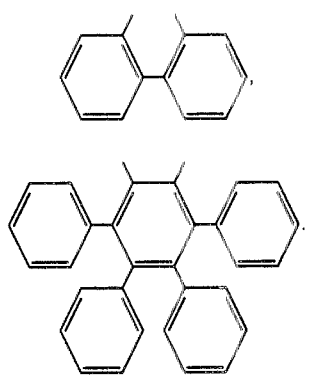

Z(C)

Z(D)

12. A curable composition of claim 1, wherein l, m, and n in formula [I] are all 0.

13. A curable composition of claim 1, wherein each of $Y_1$, $Y_2$, and $Y_3$ in formula [I] is a residue represented by the formula

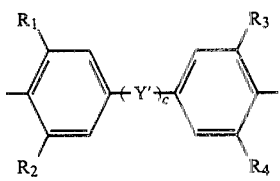

(Y'a)

wherein, c is 0 or 1, Y' is —$CH_2$—,

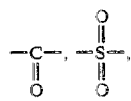

—O—, or —S—, each of $R_1$ and $R_3$ is alkyl of 1 to 6 carbon atoms, and each of $R_2$ and $R_4$ is hydrogen or alkyl of 1 to 6 carbon atoms.

14. A curable composition of claim 13, wherein each of $Y_1$, $Y_2$, and $Y_3$ in formula [I] is a residue represented by the formula

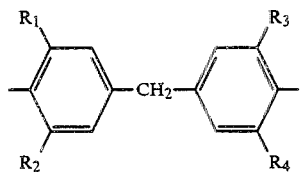

Y(A)

wherein each of $R_1$ and $R_3$ is —$CH_3$—, —$CH_2CH_3$, or —$CH(CH_3)_2$ and each of $R_2$ and $R_4$ is —H, —$CH_3$, —$CH_2CH_3$, or —$CH(CH_3)_2$.

15. A curable composition of claim 14, wherein each of $Y_1$, $Y_2$, and $Y_3$ in formula [I] is a residue represented by the formula

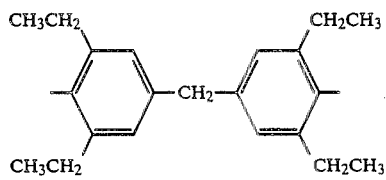

Y(B)

16. A curable composition of claim 1, wherein each of $Y_1$, $Y_2$, and $Y_3$ in formula [I] is a residue represented by the formula

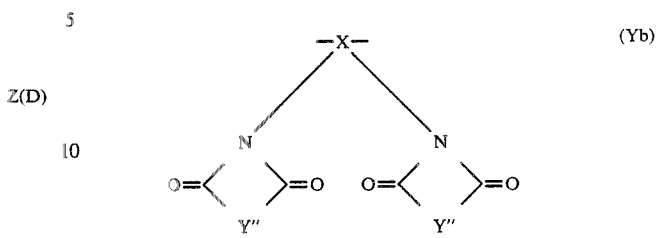

(Yb)

wherein X is as defined in claim 1 and Y" is an aromatic hydrocarbon residue of 6 to 30 carbon atoms.

17. A curable composition of claim 16, wherein each of $Y_1$, $Y_2$, and $Y_3$ in formula [I] is a residue represented by the formula

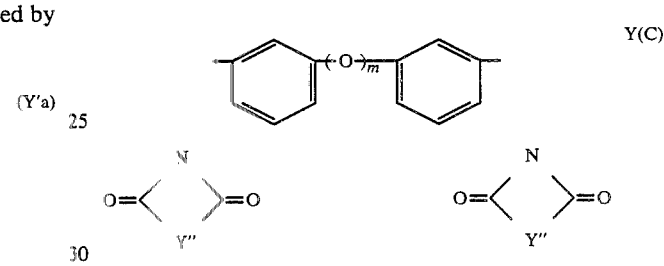

Y(C)

wherein m is 0 or 1 and Y" is

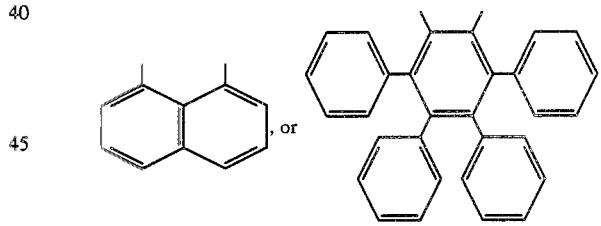

18. A curable composition of claim 1, which comprises further a compound having at least one active carbon-carbon double bond.

19. A curable composition of claim 18, which comprises further a polyacrylate compound.

20. A curable composition of claim 19, which comprises further a compound represented by the formula

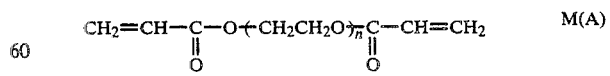

M(A)

wherein n is a number of 1 to 20.

21. A curable composition of claim 20, which comprises further tetraethylene glycol diacrylate.

22. A curable composition of claim 1, which comprises further an imide compound represented by the formula

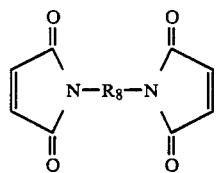

wherein $R_8$ is an organic residue containing no reactive carbon-carbon double bond.

23. A curable composition of claim 1, which comprises further a photosensitive polyimide precursor consisting of recurring units represented by the formula

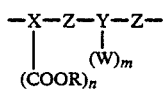

wherein, X is a (2+n)-valent carbocyclic or heterocyclic residue, Y is a (2+m)-valent carbocyclic or heterocyclic residue, Z is

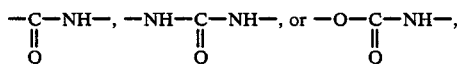

R is hydrogen or a hydrocarbon residue, W is a residue which, on heat treatment, reacts with the carbonyl of COOR to release ROH and form a ring, n is 1 or 2, m is 0, 1, or 2, and COOR and Z are at positions ortho or peri to each other.

24. A curable composition of claim 1, wherein said polymerization initiator is an oxime initiator represented by the formula

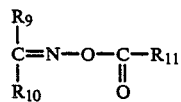

wherein each of $R_9$, $R_{10}$, and $R_{11}$ is a residue containing no reactive carbon-carbon bond.

25. A curable composition of claim 24, in which said polymerization initiator is 1,3-diphenylpropanetrione-2-(o-ethoxycarbonyl)oxime.

26. A curable composition of claim 1, wherein the content of the polymerization initiator is from 0.1 to 15% by weight based on the polyimide used as component (a).

27. A curable composition of claim 26, wherein the content of the polymerization initiator is from 0.1 to 10% by weight based on the polyimide used as component (a).

28. A curable composition of claim 18, wherein the content of the compound having at least one active carbon-carbon double bond is up to 20% by weight based on the polyimide used as component (a).

29. A curable composition of claim 23, wherein the content of the photosensitive polyimide precursor is up to 50% by weight based on the polyimide used as component (a).

30. A curable composition of claim 1, which comprises further as a sensitizer a combination of bis(dialkylamino)benzophenone, a mercapto-containing aromatic heterocyclic compound, and a compound represented by the formula

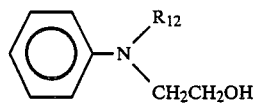

wherein $R_{12}$ is hydrogen or an aliphatic or aromatic residue which may or may not contain hydroxyl(s).

31. A curable composition of claim 30, in which said sensitizer is a combination of 4,4'-bis(diethylamino)benzophenone, 1-phenyl-5-mercapto-1H-tetrazole, and N-phenylethanolamine.

32. A heat-resistant film prepared from the curable composition of claim 1.

33. A composition of claim 1 comprising (a), (b) and, optionally, (c), wherein (c) is a member selected from the group consisting of a compound having at least one active carbon-carbon double bond; an imide compound of the formula

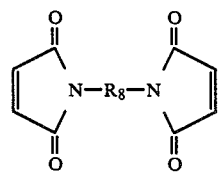

wherein $R_8$ is an organic residue containing no reactive carbon-carbon double bond; a photosensitive polyimide precursor consisting of recurring units represented by the formula

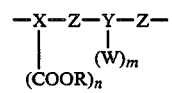

wherein, X is a (2+n)-valent carbocyclic or heterocyclic residue, Y is a (2+m)-valent carbocyclic or heterocyclic residue, Z is

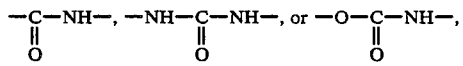

R is hydrogen or a hydrocarbon residue, W is a residue which, on heat treatment, reacts with the carbonyl of COOR to release ROH and form a ring, n is 1 or 2, m is 0, 1, or 2, and COOR and z are at positions ortho or peri to each other; and a sensitizer combination of bis-(dialkylamino)benzophenone, a mercapto-containing aromatic heterocyclic compound, and a compound represented by the formula

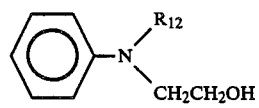

wherein $R_{12}$ is hydrogen or an aliphatic or aromatic residue which may or may not contain hydroxyl(s).

34. A heat-resistant film, the structure of which is that of a cured composition wherein the composition is a composition of claim 1.

* * * * *